United States Patent [19]

Maida

[11] 4,322,149
[45] Mar. 30, 1982

[54] ELECTRIC DRIVING DEVICE OF A CAMERA

[75] Inventor: Osamu Maida, Tokyo, Japan

[73] Assignee: Nippon Kogaku K.K., Tokyo, Japan

[21] Appl. No.: 117,804

[22] Filed: Feb. 1, 1980

[30] Foreign Application Priority Data

Aug. 15, 1979 [JP] Japan .............................. 54/103161

[51] Int. Cl.³ .............................................. G03B 1/18
[52] U.S. Cl. ..................................... 354/173; 354/171
[58] Field of Search ................................ 354/171, 173

[56] References Cited

U.S. PATENT DOCUMENTS 3,882,516  5/1975  Ogiso et al. .......................... 354/173
4,196,993  4/1980  Stemme et al. ...................... 354/173
4,229,091 10/1980  Date et al. .......................... 354/173

*Primary Examiner*—Russell E. Adams
*Attorney, Agent, or Firm*—Fitzpatrick, Cella, Harper & Scinto

[57] ABSTRACT

An electric driving device of a camera for winding up a film by a motor comprises means for generating a windup signal when an exposure has been completed, means operable by reception of the wind-up signal to drive the motor for said wind-up, torque detecting means for detecting an increase in wind-up torque resulting from completion of said wind-up and putting out an output, and forcible stopping means responsive to the output of the torque detecting means to stop the motor separately from the operation of the motor driving means.

5 Claims, 3 Drawing Figures

ELECTRIC DRIVING DEVICE OF A CAMERA

BACKGROUND OF THE INVENTION

1. Field of the Invention

This invention relates to an electric driving device of a camera.

2. Description of the Prior Art

Various techniques have heretofore been proposed and used regarding the electric driving device of a camera for winding up a film by the drive force of a motor. However, in the prior art techniques, there has been proposed no electric driving device of the type which detects an increase in wind-up torque resulting from continuously driving a wind-up shaft by a motor after completion of film wind-up and stops the motor upon such detection.

SUMMARY OF THE INVENTION

It is the object of the present invention to provide a novel electric driving device of the class described which has never been proposed.

According to the present invention, there is provided an electric driving device for a camera for winding up a film by a motor which comprises means for generating a wind-up signal when an exposure has been completed, means operable by reception of said wind-up signal to drive the motor for said wind-up, torque detecting means for detecting an increase in wind-up torque resulting from completion of said wind-up and putting out an output, and forcible stopping means responsive to the output of said torque detecting means to stop said motor separately from the operation of said motor driving means.

The invention will become more fully apparent from the following detailed description thereof taken in conjunction with the accompanying drawings.

DESCRIPTION OF THE PREFERRED EMBODIMENTS

Figure 1:
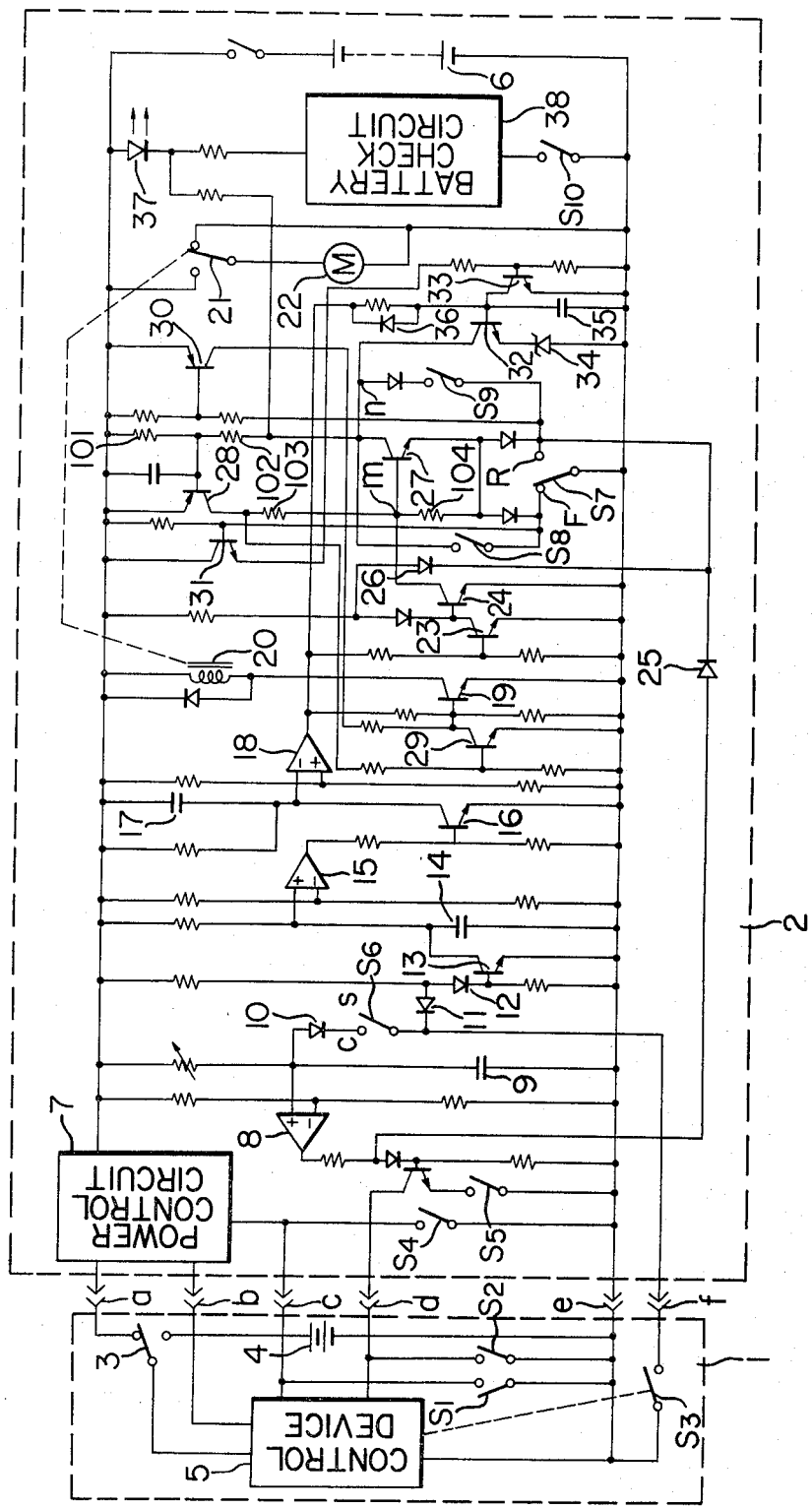
FIG. 1 is a circuit diagram showing an embodiment of the electric wind-up device of a camera according to the present invention.

An embodiment of the present invention will hereinafter be described with reference to the accompanying drawings. The camera shown in FIG. 1 comprises a camera body 1 and a motor drive device 2 removably mounted thereon. A power source change-over switch 3 is automatically changed over from a power source 4 contained within the camera body 1 to a power source circuit provided in the motor drive device 2 when the motor drive device is mounted on the camera body. A half-push switch $S_1$ is operable in such a manner that it is closed when the unshown shutter button of the camera body is depressed by one stage, and a control device 5 includes an exposure control circuit, a display circuit, a release device, a shutter device, etc., and of these, the display circuit is operated by closing of the switch $S_1$ to display a pre-arranged exposure adjustment value or the like. When the shutter button is further depressed, a release switch $S_2$ transmits a release signal to the control device 5 to effect shutter release. A motor driving switch $S_3$ is adapted to be closed during the time following the operation of closing the aperture of the rearward curtain of a focal plane shutter has been started until this rearward curtain is completely closed (namely, until exposure is completed), and to be opened upon completion of film advance and shutter charge. The camera body 1 and the motor drive device 2 are coupled together by electrical contents a, b, c, d, e and f and a mechanical coupling device (not shown) such as wind-up coupling and rewind coupling. The motor drive device 2 has a power source 6, a power source control circuit 7 including a constant voltage circuit for controlling the camera, a half-push switch $S_4$ and a release switch $S_5$. When the unshown shutter button of the motor drive device is depressed by one stage, the half-push switch $S_4$ is closed to operate the power source control circuit 7 and supply power by the control device 5 of the camera body 1 through the contact a while, at the same time, the ON signal of the switch $S_4$ is transmitted through the contact c to the control device 5 of the camera body 1 to operate the display circuit, etc. in the control device 5, whereby the prearranged exposure adjustment value, etc. are displayed. Such state is held by a hold signal being transmitted from the control device 5 through the contact b to the power source control circuit 7 for a predetermined time even if the half-push switch $S_4$ is opened, and in the meantime the photographer can see the display of the prearranged exposure adjustment value, etc. When the shutter button is further depressed, the release switch $S_5$ is closed. A comparing circuit 8, a capacitor 9 and a resistor together constitute a release timing circuit for holding the biased condition of a transistor connected to one end of the release switch $S_5$ during the opening of a selector switch $S_6$ for one-frame photography and continuous photography and for biasing said transistor each time the motor driving switch $S_3$ is opened upon completion of film advance during the closing of the selector switch $S_6$ to effect the charging of the capacitor 9. Each time it is turned on, the transistor connected to one end of the release switch $S_5$ transmits a release signal to the control device 5 through the contact d to release the shutter. Diodes 11, 12, transistor 13, capacitor 14, comparing circuit 15, transistor 16 and resistor together constitute a wind-up delaying circuit adapted to be operated upon closing of the motor driving switch $S_3$ and to put out a wind-up signal after a predetermined time (after completion of exposure). A capacitor 17, comparing circuit 18 and resistor together constitute a motor stoppage delaying circuit for receiving the wind-up signal from the wind-up delaying circuit and immediately putting out a motor driving signal and continuing to put out the motor driving signal for a predetermined time even after the motor driving switch $S_3$ is opened upon completion of the film advance so that the wind-up signal is no longer received. A transistor 19 is adapted to be turned on by the motor driving signal to effect power supply to a relay coil 20 and, when current flows to the relay coil 20, a relay contact 21 is changed over to rotate a motor 22. Transistors 27, 28, resistors 101–104 and a capacitor together constitute a positive feedback circuit which is a latch circuit for putting out a motor stop signal upon detection of a torque after completion of the film advance which will hereinafter be described. Transistors 23 and 24 together constitute a reset circuit for resetting the latch circuit. A selector switch $S_7$ is for selecting one of the wind-up and the rewind of the film and when it is closed at the contact F side, it effects the wind-up control and when it is closed at the contact R side, it effects the rewind control. A torque switch $S_8$ is normally open as will later be described and is adapted to be momentarily closed by detecting an increase in wind-up torque at the completion of the film advance or at the termination of the film, and then immediately opened. This switch $S_8$ and the aforementioned latch circuit 27, 28, 101–104 and a transistor 29 to be described together constitute a forcible stopping circuit for detecting an increase in torque and stopping the motor. A rewind stop switch $S_9$ is a switch adapted to be closed when the film is all rewound during the film rewind and becomes disengaged from a sprocket, and this switch is opened when the film is placed on the sprocket and a back lid is closed. This switch $S_9$ is attached to the back lid of the camera and is electrically connected to the motor drive device by a contact, not shown. A transistor 32, Zener diode 34, capacitor 35, diode 36 and resistor together constitute a protective timer circuit for triggering the latch circuit and cutting off the motor current when the time during which the motor is supplied with power exceeds a predetermined time, so as to prevent the motor from being burnt or the battery from being wastefully consumed by a current continuing to flow to the motor when the torque switch $S_8$ goes wrong or when the voltage drops to render the torque switch $S_8$ inoperative. If a battery check switch $S_{10}$ is closed and when the source voltage exceeds a prescribed voltage level, a battery check circuit 38 drives LED 37 through a resistor to turn on the LED.

In such a circuit construction, the operation is effected in the following manner. Description will first be made of a case where the motor drive device has been mounted and the switch $S_6$ has been placed at position S (OFF . . . one-frame photography) while the switch $S_7$ has been placed at position F ( . . . wind-up). Before the shutter is released, the switch $S_6$ is in OFF position and therefore, the charging of the capacitor 9 is effected and the comparing circuit 8 is biasing the transistor connected to one end of the switch $S_5$. Also, the motor driving switch $S_3$ is in OFF position and the transistor 13 is being biased to its ON state. Accordingly, the capacitor 14 of the wind-up delaying circuit is discharged and the output of the comparing circuit 15 has become low, so that the transistor 16 is in its OFF state and the capacitor 17 of the motor stoppage delaying circuit is discharged through a resistor parallel-connected to the capacitor 17 and the output of the comparing circuit 18 has become low. Consequently, the transistor 19 is in its OFF state and the motor has been stopped, and the transistor 23 is in its OFF state while the transistor 24 becomes turned on, so that the transistors 27 and 28 of the latch circuit are in their OFF state. That is, the latch circuit is in its reset condition. The torque switch $S_8$ is in its OFF position.

In such condition, when the unshown shutter button provided on the motor drive device is depressed to close the switches $S_4$ and $S_5$, the transistor connected to one end of the switch $S_5$ is turned on because it is biased by the comparing circuit 8, and the release signal is transmitted to the control device 5. When the shutter is released, exposure is effected and the rearward shutter curtain starts the closing operation. The motor driving switch $S_3$ is closed in response to the closing operation of the shutter and before the rearward shutter curtain completely closes the aperture. When the switch $S_3$ is closed, the bias voltage of the transistor 13 is clamped by the diode 11 and therefore, the transistor 13 becomes turned off to start the charging of the capacitor 14 and, when a predetermined time until the rearward shutter curtain completely closes the aperture elapses, the output of the comparing circuit 5 is changed to high to turn on the transistor 16. By the turn-on of this transistor 16, the wind-up delaying circuit comes to put out a wind-up signal. When the transistor 16 is turned on, the capacitor 17 is momentarily charged and the output of the comparing circuit 18 is changed to high. That is, the motor stoppage delaying circuit comes to put out a motor driving signal. When the output of the comparing circuit 18 becomes high, the transistor 23 is turned on while the transistor 24 is turned off and the latch circuit becomes operable, but since there is no trigger input of the latch circuit, the transistors 27 and 28 are in OFF state and the transistor 29 also remains in OFF state. Accordingly, the transistor 19 receives the output of the comparing circuit 18 and is turned on thereby, and the relay coil 20 is electrically energized to rotate the motor 22 while, at the same time, the capacitor 35 of the protective timer circuit starts to be charged by a resistor parallel-connected to the diode 36.

Film advance is effected by the rotation of the motor through a wind-up coupling, not shown, and since the start of rotation of the motor 22 is delayed by a predetermined time determined by the wind-up delaying circuit after the motor driving switch $S_3$ has been turned on, film transport is effected after the rearward shutter curtain has completely closed the aperture (after exposure has been completed). The film advance progresses by the motor 22 and, when the film advance is completed, the motor driving switch $S_3$ becomes open and the transistor 13 is turned on, so that the capacitor 14 is momentarily discharged and the output of the comparing circuit 15 is changed to low and the transistor 16 becomes turned off. However, even if the transistor 16 becomes turned off, the capacitor 17 is discharged little by little by a parallel-connected resistor and therefore, the output of the comparing circuit 18 is not immediately varied but maintains its high condition for a predetermined time after the switch $S_3$ has become open (at least, for the time until the latch circuit to be described is operated), and the motor 22 continues to rotate with the transistor 19 remaining in ON state.

On the other hand, when the film advance is completed, a film advance device such as unshown sprocket on the camera body side is retained immovably, but the motor continues to rotate and therefore, the film advance torque is increased. Then, a torque detecting mechanism to be described is operated and the torque switch $S_8$ is momentarily closed. By the closing of the torque switch $S_8$, a trigger signal is applied to a junction n to trigger the latch circuit and turn on the transistors 27 and 28. That is, a motor stopping signal is generated. Thereby, the transistor 29 is turned on and in spite of the fact that the output of the comparing circuit 18 is high, the transistor 19 is turned off to cut off the power supply to the relay coil 20 and forcibly stop the motor 22. After the latch circuit has been triggered by the switch $S_8$, the discharging of the capacitor 17 progresses and the output of the comparing circuit 18 is changed to low to turn off the transistor 23 and turn on the transistor 24, so that a reset signal is applied to a junction m to reset the latch circuit and the transistors 27, 28 and 29 are turned off and the transistor 19 maintains its OFF state. The aforementioned predetermined time until the output of the comparing circuit is reversed is equal to or a little longer than the time from after the film advance in the camera has been completed during the lowest voltage allowable for the specification of the motor drive device until the torque switch $S_8$ is closed.

The protective timer circuit constituted by the transistor 32, Zener diode 34, capacitor 35, diode 36 and resistor is not operated within the ordinary wind-up time and, when the output of the comparing circuit 18 has been changed to low, the charge stored in the capacitor 35 is quickly discharged by the diode 36.

During the time that the latch circuit is operated, namely, during the time from after the torque switch $S_8$ has been closed until the output of the comparing circuit 18 is reversed to reset the latch circuit, LED 37 is turned on to enable it to be monitored that the torque switch $S_8$ is properly operated. In this manner, one-frame photography and the next one-frame film advance are terminated. Even if the shutter button (not shown) of the motor drive device remains depressed, the transistor connected to one end of the switch $S_5$ maintains its ON position and therefore, the next release signal is not applied to the control device 5.

Description will now be made of the operation in a case where the switch $S_6$ has been brought to position C (ON . . . continuous photography).

When the switch $S_6$ is in ON position, a first frame photography and the next frame film advance are also effected in the same manner as previously described. However, when the motor driving switch $S_3$ is in ON position, the discharging of the capacitor 9 is effected through a reverse current blocking diode 10 and a contact f. Accordingly, the output of the comparing circuit 8 changes to low and the transistor connected to this output end is once turned off. When the motor driving switch $S_3$ is opened upon completion of the film advance, the capacitor 9 again starts to be charged and, after a predetermined time, for example, after the motor 22 has been stopped, the output of the comparing circuit 8 constituting a release timing circuit is changed to high and, if the release switch $S_5$ is in its ON position at that time, the transistor biased by the output of the comparing circuit is turned on to again transmit the release signal to the control device 5, thus effecting shutter release and continuous photography. By varying a variable resistor for charging the capacitor 9 which determines the release timing, the photographing frame speed during continuous photography can be determined as desired.

When the film take-up progresses and the terminal end of the film is reached, the wind-up device of the camera body can no longer draw the film out of the magazine and, due to the stoppage of the sprocket, the wind-up device of the camera body usually becomes immovable before the film advance is completed. However, even if the wind-up device is stopped, the motor driving switch $S_3$ is in ON position and the motor 22 tries to rotate. Then, the torque switch $S_8$ is operated by an increase in film advance torque and is momentarily closed to trigger the latch circuit and stop the motor 22. Since the switch $S_3$ remains in ON position, the output of the comparing circuit 8 is maintained high and the transistor 24 of the reset circuit is maintained in OFF state and the ON state of the transistors 27 and 28 of the latch circuit is maintained, whereby the entire sequence is stopped with the LED 37 continuously turned on, thus indicating that the film has come to its terminal end.

In a case where the torque switch $S_8$ becomes inoperable due to the insufficient motor drive force resulting from the source voltage drop at the termination of the film or where the torque switch $S_8$ goes wrong and does not operate, the protective timer circuit causes the turn-on of the transistor 32, the triggering of the latch circuit and the turn-on of the transistor 29 in succession when the charging potential of the capacitor 35 exceeds the threshold voltage determined by the voltage of the Zener diode 34 and the base-emitter voltage of the transistor 32 in a predetermined time after the switch $S_3$ has been closed, thereby stopping the power supply to the motor 22 and turning on the LED 37.

The operation during the film rewind will now be described. The film rewind is accomplished by changing over the switch $S_7$ to the contact R side. The change-over of the switch $S_7$ is effected in the following manner. When a wind-up and rewind change-over lever, not shown, is changed over from the wind-up side to the rewind side, a drive gear and a wind-up gear train are first disconnected from each other, and then the switch $S_7$ moves away from its contact F to its neutral position and in response thereto, a rewind button, not shown, is operated to make the sprocket free. The switch $S_7$ is further changed over from its neutral position to its contact R and at last, the drive gear becomes coupled to the rewind gear train to enable the rewind to take place. The above-described series of operations are continuously effected by one operation of changing over the wind-up and rewind change-over lever to the rewind side, and the change-over from the rewind to the wind-up is effected in the order reverse to that described above. The change-over operation for the rewind may take place in two cases, namely, in a case where the motor 22 is stopped before the camera completes the wind-up operation and in a case where the motor is stopped when the camera has completed the wind-up operation. The rewind from the condition before the wind-up operation is completed is effected in the following manner. As previously described, at the termination of the film, it is often the case that the camera is stopped with the wind-up operation not yet completed, and in such case, the motor driving switch $S_3$ is in ON position and the output of the comparing circuit 18 is high and the transistors 27 and 28 of the latch circuit are turned on by the operation of the torque switch $S_8$. In such condition, when the wind-up and rewind change-over lever is moved to change over the switch $S_7$ from its contact F to its neutral position, the transistors 27 and 28 are turned off to reset the latch circuit and the transistor 29 is turned off, so that the transistor 19 is turned on to start to rotate the motor. At the same time, the transistor 31 is biased and turned on, so that the transistor 33 is turned on and the discharging of the capacitor 35 is effected to reset the protective timer circuit. The transistor 32 is turned off. At this time, the drive gear meshes with neither the wind-up gear train nor the rewind gear train and therefore, neither wind-up nor rewind takes place. When the switch $S_7$ is connected to its contact R side, the latch circuit becomes ready to operate, but the aforementioned rewind stop switch $S_9$ is in OFF position because the film has not yet been rewound, and accordingly, the latch circuit is not triggered. Further, when the change-over lever is completely changed over to the rewind side, the drive gear and the rewind gear train come into mesh engagement to effect the rewind. When the film rewind progresses and the leading end of the film is disengaged from the sprocket (or the take-up spool) of the camera, namely, when the film rewind is terminated, the rewind stop switch $S_9$ is closed to apply a trigger signal to the junction n and trigger the latch circuit and the transistor 29 is turned on, so that the transistor 19 is turned off to stop the motor and turn on the LED 37, which thus displays the termination of the rewind. In such condition, even if the back lid of the camera is opened to remove the film therefrom and the rewind stop switch $S_9$ is opened, the once triggered latch circuit maintains its operation and the motor 22 is not rotated. Where design is made such that, for example, the rewind coupling is retracted from the magazine chamber during the film advance in response to the wind-up and rewind change-over lever and said coupling comes into the magazine chamber during the rewind, if the wind-up and rewind change-over lever is brought down to the wind-up side to remove the magazine from the magazine chamber after completion of the rewind and the rewind coupling is retracted from the magazine chamber, the switch $S_7$ becomes connected to the contact F. Where such a design is adopted, the latch circuit is reset when the switch $S_7$ has been brought to its neutral position, and the motor driving switch $S_3$ remains in its ON position and therefore, the motor 22 is driven until the wind-up operation is completed, whereupon the motor is stopped, but by this time, the rewind has already been completed and the engagement between the sprocket and the perforations of the film has been released and thus, the exposed film is not again drawn out of the magazine. Loading of unexposed film may be done thereafter.

Next, the rewind when the motor is stopped with the camera having completed the wind-up operation is effected in the following manner.

Since the wind-up operation has been completed, the motor driving switch $S_3$ is in OFF position and accordingly, the output of the comparing circuit 8 is low. Even if the wind-up and rewind change-over lever is changed over to the rewind side and the switch $S_7$ is disengaged from the contact F, the transistor 19 is turned off by the output of the comparing circuit 18 at this time and therefore, the motor 22 is not yet rotated. When the switch $S_7$ is connected to the contact R, the transistor 30 is turned on and thereby the transistor 19 is turned on, so that the motor 22 is rotated. At the same time, the bias of the transistor 24 is clamped by the diode 26, so that the transistor 24 is turned off and the latch circuit becomes operable. When the wind-up and rewind change-over lever is completely changed over to the rewind side, the drive gear and the rewind gear train come into mesh engagement as already described, to effect the film rewind. The operation thereafter is the same as what has been described previously. After completion of the rewind, when the wind-up and rewind change-over lever is returned to its initial position and the switch $S_7$ is disengaged from the contact R, the latch circuit is reset because the camera is in the wind-up completed condition and, at the same time, the transistor 30 is turned off, so that the bias source of the transistor 19 becomes exhausted and the motor remains stopped and such condition remains unchanged even if the switch $S_7$ is connected to the contact F.

Also, the above-described device is designed such that in order to prevent erroneous exposure which would result from depressing, by mistake, the release button when the film rewind is effected with the wind-up operation being completed, to thereby close the release switch $S_5$ and release the shutter during the rewind, when the rewind is being effected with the switch $S_7$ changed over to the contact R side, the bias of the transistor connected to the output of the comparing circuit 8 is clamped by the diode 25 to thereby prevent the release signal from being transmitted to the camera body even if the release switch $S_5$ is closed.

Figure 2:
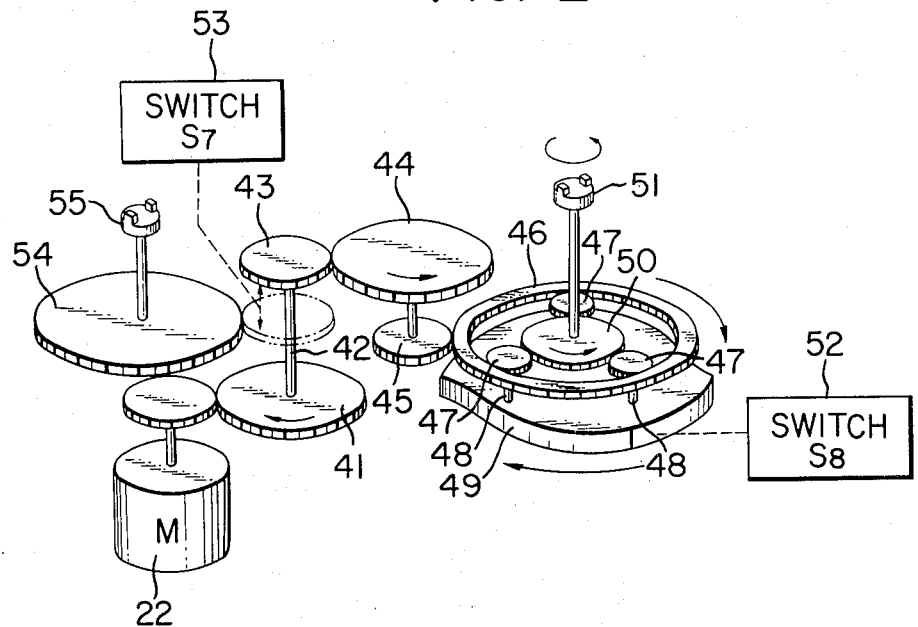
FIG. 2 is a perspective view showing an example of the operating mechanism for a torque switch.
Figure 3:
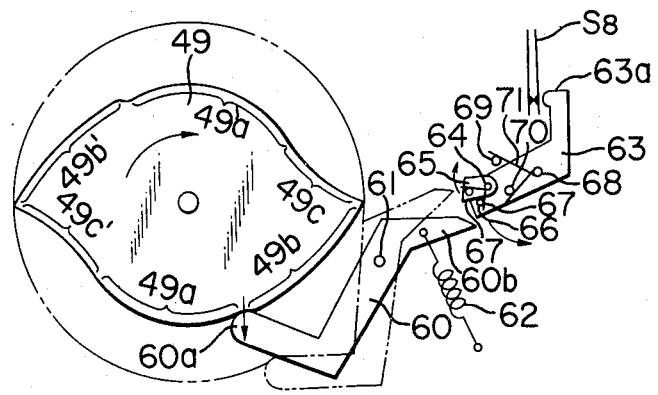
FIG. 3 is a plan view showing a specific example of the torque detecting mechanism.

FIGS. 2 and 3 shown an example of the operating mechanism for the torque switch in the circuit described in connection with FIG. 1. In FIG. 2, an axially slidable gear 43 is provided on a shaft 42 driven by a gear 41 which normally meshes with a motor pinion gear. The gear 43 is rotatable with the shaft 42, but the axial position thereof is determined by the wind-up and rewind change-over lever which operates the switch $S_7$. The solid-line position of the gear 43 in which it is in mesh engagement with a gear 44 is the position during the wind-up condition and, when the rewind condition is brought about, the gear 43 comes to assume a position indicated by phantom lines, in which the gear 43 meshes with a gear 54 to transmit the drive force to a rewind coupling 55 connected to the rewind device (not shown) of the camera body. The switch $S_7$ is disengaged from the contact R side of FIG. 1 at a position in which the gear 43 becomes disengaged from the gear 44 during the displacement of the gear 43 from its solid-line position to its phantom-line position, and the switch $S_7$ becomes connected to the contact R side before the gear 43 meshes with the gear 54.

The drive force transmitted by the mesh engagement between the gears 43 and 44 is further transmitted through a gear 45, a gear 46, gears 47 and a gear 50 to a wind-up coupling 51 coupled to the wind-up device (not shown) of the camera body. The gear 46 has external teeth meshing with the gear 45 and internal teeth meshing with the gears 47, and the shafts 48 of the gears 47 are supported on a cam plate 49 formed coaxially with the gears 46 and 50. The gears 46, 47 and 50 together constitute a planetary gear mechanism. A cam is formed on the end surface of the cam plate 49, and a torque detecting mechanism 52 which is in contact with the cam operates the torque switch $S_8$. That is, the rotation of the motor 22 is transmitted to the gear 46 when the gear 43 is in mesh engagement with the gear 44, so that the gear 46 is rotated clockwisely, and the gear 50 and the coupling 51 try to rotate counter-clockwisely through the gear 47 and the cam plate 49 tries to rotate clockwisely through the shafts 48. During the wind-up operation, the rotational force of the gear 44 is divided into a force for driving the coupling 51 and a force for driving the cam plate 49, and a relatively small rotational force is transmitted to the cam plate 49. Consequently, when a relatively small rotational force is being applied to the cam plate 49, the torque detecting mechanism 52 may block the rotation thereof and, when the sprocket stops rotating due to the completion of the film advance and the rotation of the wind-up coupling 51 is blocked to increase the rotational force of the cam plate 49, the torque detecting mechanism 52 may detect such rotational force and operate the torque switch $S_8$. A specific example of the torque detecting mechanism 52 described above will now be explained by reference to FIG. 3. The cam surface of the above-described cam plate 49 has arcuate portions 49a and 49a' each having a small radius, and cam portions 49b, 49b', 49c and 49c'. A first lever 60 contacting the cam surface is rotatable about a pivot 61 and biased for clockwise rotation by a spring 62 having one end fixed, so that the fore end 60a of the first lever contacts the cam plate 49. A second lever 63 is rotatable about a pivot 68, and a spring 71 is hooked between a spring engaging pin 70 provided on the second lever and the rotation stopping pin 69 of the second lever, and the second lever is biased for clockwise rotation and retained by the rotation stopping pin 69. A third lever 65 rotatable about a shaft 64 provided on the second lever has a spring 72 hooked between a spring engaging pin 67 on the third lever and a rotation stopping pin 66 provided on the second lever, and the third lever is biased for counter-clockwise rotation and retained by the rotation stopping pin 66. The fore end and the third lever and the end 60b of the first lever are engageable with each other. The end 63a of the second lever 63 is designed to close the torque switch $S_8$ when this lever has been rotated counter-clockwise. The solid lines show the state in the course of the film advance of the camera and in this state, a clockwise rotational force is being transmitted to the cam plate 49. However, with the rotation of the cam plate 49 being blocked by the engagement between the riser portion of the cam formed between 49a and 49b and the fore end 60a of the first lever biased by the spring 62, only the wind-up coupling 51 is rotated to effect the film advance. When the wind-up device including the sprocket, etc. is stopped due to the completion of the film advance, the coupling 51 stops rotating and therefore, the rotational force transmitted to the cam plate 49 is sharply increased and that force becomes greater than the retaining force of the first lever 60 and thus, the cam plate 49 is rotated clockwisely and with this rotation, the first lever 60 is rotated counter-clockwisely by the cam portion 49b and the first lever is rotated at maximum to a position indicated by dots-and-dash line. During the time that it is driven to the dots-and-dash line position, the end 60b of the first lever interferes with the fore end of the third lever 65, but at that time, the second lever 63 is retained by the rotation stopping pin 69 and thus, it is immovable and only the third lever 65 is rotated clockwisely. Since design is made such that the end 60b of the first lever and the fore end of the third lever 65 passes the interference area before the first lever reaches its dots-and-dash line position, the third lever returns to a position in which it is again retained by the rotation stopping pin 66, with the aid of the spring 72. The cam plate 49 further continues to rotate and, when the fore end 60a of the first lever comes into contact with the cam portion 49c, the first lever 60 is rotated clockwisely by the spring 62 and the end 60b of the first lever again interferes with the fore end of the third lever to try to move the third lever counter-clockwisely. However, the rotation of the third lever 65 is blocked by the rotation stopping pin 66 and therefore, that force also rotates the second lever 63. Accordingly, the torque switch $S_8$ is closed by the end 63a of the second lever and the motor 22 tries to stop as already described, but even if an electromagnetic brake is applied to the motor 22, the motor 22 is not momentarily stopped and continues to rotate a little, whereby the fore end 60a of the first lever 60 comes into contact with the arcuate portion 49a' having the same radius as that of the arcuate portion 49a. Also, during the time that the fore end 60a returns to the position in which it contacts the arcuate portion 49a', the end 60b passes the interference area with the fore end of the third lever 65 and thus, the second lever is retained by the rotation stopping pin 69 as shown. The torque switch $S_8$ comes back to its open position. In such condition, if the release button has not been depressed, the motor is stopped. Thereafter, when the shutter is released to effect exposure, the motor driving switch $S_3$ is closed and the rotational force is again transmitted to the cam plate 49 and, during the time that the film is advanced, the fore end 60a of the first lever 60 slides on the arcuate portion 49a' of the cam plate and as already described, the cam plate 49 and the fore end 60a of the first lever 60 come into engagement at the boundary between 49a' and 49b'. After the completion of the film advance, when the rotational force of the cam plate 49 is increased, the cam plate 49 is again rotated clockwisely from the position of FIG. 3.

In the above-described embodiment, an integration circuit is used as the wind-up delaying circuit and, when the output of this integration circuit has reached a predetermined value, the motor is driven. When the motor is thus driven, even if chattering occurs during the closing of the motor driving switch $S_3$, there is no possibility that the motor is thereby driven in a pulse-like manner to create noise. Accordingly, malfunctioning can be prevented.

Also, the present invention need only be an electric wind-up device and includes a so-called "auto winder" in addition to the motor drive device.

Further, the embodiment has been described with a focal plane shutter taken as an example, whereas the present invention can also be adopted for a lens shutter and may be a device which is operatively associated with the closing operation of the lens shutter and moreover, detects that this shutter is in the condition before completion of exposure and puts out a wind-up signal in a predetermined time after this point of time to thereby effect the wind-up operation.

I claim:

1. An electric driving device of a camera for winding up a film by a motor, comprising:
   (a) means for generating a wind-up signal during the time period from completion of an exposure to the time when said wind-up has been completed, said generating means including delay means for initiating a time delay interval upon completion of said wind-up for maintaining said generating means in condition to emit said wind-up signal;
   (b) means operable by reception of said wind-up signal to drive the motor for said wind-up;
   (c) torque detecting means for detecting an increase in wind-up torque resulting from completion of said wind-up and emitting an output, said delay means being constituted so that the time delay interval is greater than the time period from reception by said operable means to detection by said torque detecting means; and
   (d) forcible stopping means responsive to the output of said torque detecting means to stop said motor separately from the operation of said motor driving means.

2. The device according to claim 1, wherein said forcible stopping means includes:
   (a) switch means operatively associated with said torque detecting means; and
   (b) means responsive to said switch means to stop said motor.

3. The device according to claim 2, wherein said torque detecting means includes:
   (a) wind-up coupling means capable of being coupled to a film winding shaft provided in said camera;

(b) a transmission mechanism provided between said motor and said wind-up coupling and having a first transmission path for transmitting the drive of said motor to said wind-up coupling and a second transmission path for transmitting the drive of said motor along with an increase in said wind-up torque and putting out an output; and (c) interlocking means operatively associated with the second transmission path of said transmission mechanism to operate said switch means.

4. The device according to claim 1, wherein said delay means include:
 means for resetting said forcible stopping means when said time delay interval has elapsed.

5. The device according to claim 1, further comprising:
 timer means (32, 34-36) for operating said forcible stopping means to stop said motor after a predetermined elapsed time from generation of said wind-up signal to the completion of said wind-up.

* * * * *